US006451878B1

(12) United States Patent
Fukuzawa et al.

(10) Patent No.: US 6,451,878 B1
(45) Date of Patent: Sep. 17, 2002

(54) HIGH MOLECULAR WEIGHT EPOXY RESIN AND RESINOUS COMPOSITION FOR PRINTED CIRCUIT BOARD

(75) Inventors: Takao Fukuzawa; Takayoshi Hirai; Tetsuro Imura; Yoshinobu Ohnuma, all of Yokkaichi (JP)

(73) Assignee: Resolution Performance Products, LLC

( * ) Notice: Subject to any disclaimer, the term of this patent is extended or adjusted under 35 U.S.C. 154(b) by 0 days.

(21) Appl. No.: 09/705,223

(22) Filed: Nov. 2, 2000

(30) Foreign Application Priority Data

Mar. 21, 2000 (JP) ........................................ 2000-077492

(51) Int. Cl.$^7$ ................................................. C08K 3/32
(52) U.S. Cl. ........................ 523/451; 525/389; 525/930; 528/99; 528/405
(58) Field of Search ................................ 525/389, 930; 528/99, 405; 523/451; 428/418; 174/255

(56) References Cited

U.S. PATENT DOCUMENTS 5,310,854 A * 5/1994 Heinmeyer ................ 528/104

FOREIGN PATENT DOCUMENTS

| JP | 5295090 | 11/1993 |
| JP | 6128461 | 5/1994 |
| JP | 9067555 | 3/1997 |

OTHER PUBLICATIONS

Chemical Abstracts, Registry File Printout, 2001.*

* cited by examiner

Primary Examiner—Robert Dawson
Assistant Examiner—D. Aylward

(57) ABSTRACT

A high molecular weight epoxy resin obtained by polymerization reaction of a difunctional epoxy resin (X) with a dihydric phenol compound (Y) containing 70–100% by weight of bisphenol S in the presence of a catalyst, the high molecular weight epoxy resin being characterized in that a weight average molecular weight thereof is 10,000–200,000. A resinous composition for a printed circuit board, comprising the high molecular weight epoxy resin, an epoxy resin other than the above-mentioned resin and a curing agent as essential components.

18 Claims, 1 Drawing Sheet

HIGH MOLECULAR WEIGHT EPOXY RESIN AND RESINOUS COMPOSITION FOR PRINTED CIRCUIT BOARD

FIELD OF THE INVENTION

The present invention relates to a high molecular weight epoxy resin which is characterized by containing highly pure bisphenol S substantially without bromine and which has a high glass transition temperature, and to an epoxy resinous composition containing the high molecular weight epoxy resin, an epoxy resin other than the high molecular weight epoxy resin and a curing agent as essential components. In particular, the invention relates to a resinous composition for a printed circuit board comprising the epoxy resinous composition.

BACKGROUND OF THE INVENTION

Epoxy resins are used widely in paints, civil engineering adhesion and electrical uses, and, in particular, such resins as called phenoxy resins of BPA type having high molecular weights are used as base resins of varnish for paints and as base resins for filming, and also for adjustment of fluidity when added to epoxy resinous varnishes and for improvement in tenacity when cured. Those having bromine in its chemical structure are also used as flame retardants when blended with thermoplastic resins.

On the other hand, in the case of printed circuit boards used in electric and electronic devices, there are further required more multiple lamination, higher densification, thinning, lightening, high reliability and moldability with miniaturization, lightening and highly functioning of devices, in particular for multi-layered printed circuit boards. In reply to the requirements, there have been developed new methods for preparation of multi-layered printed circuit boards such as a buildup method. Therefore, there are required epoxy resins having high performances suitable for the methods.

As resins for multi-layered electric laminates, epoxy resins mainly having TBBA structure and containing bromine have been hitherto used. However, due to recent environmental problems, materials without halogen are being required. As counterplans therefor, there have been proposed uses of BPA type epoxy resins and multifunctional type epoxy resins. They are, however, not satisfactory in heat resistance, moldability or electrical characteristics. Thus, there has been desired an epoxy resin which satisfies these requirements and which does not substantially contain halogen.

Further, there are propositions to improve moldability or physical properties by adding BPA type high molecular weight epoxy resins or phenoxy resins. These are described, for example, in Japanese Patent Application Laid-open No. Hei 6-128461 and Japanese Patent Application Laid-open No. Hei 9-67555, but there is no description that bisphenol S type high molecular weight epoxy resins are used. Further, in Japanese Patent Application Laid-open No. Hei 5-295090, a bisphenol S type epoxy resin is described as one of difunctional epoxy resins that are raw materials of high molecular weight epoxy resins. There is, however, no description about purity and content of bisphenol S and, further, there is no description about characteristics as the bisphenol S containing high molecular weight epoxy resin.

In the case that a high molecular weight epoxy resin or phenoxy resin is added to a composition for a printed circuit board, moldability, flexibility, impact resistance and adhesiveness may be improved but heat resistance and insulating property become inferior when the composition is used to form the printed circuit board.

It is desirable to provide a high molecular weight epoxy resin containing highly pure bisphenol S without bromine, which is necessary for obtaining a composition for a printed circuit board superior in heat resistance, moldability, flexibility, impact resistance and adhesiveness, and also provides a resinous composition comprising the high molecular weight epoxy resin and a composition for a printed circuit board comprising the resinous composition.

SUMMARY OF THE INVENTION

There is now provided a high molecular weight epoxy resin obtained by polymerization reaction of a difunctional epoxy resin (X) with a dihydric phenol compound (Y) containing 70–100% by weight of bisphenol S in the presence of a catalyst, the high molecular weight epoxy resin being characterized in that a weight average molecular weight thereof is 10,000–200,000.

In one embodiment, there is also provided a high molecular weight epoxy resin as described above, characterized in that bisphenol S in the dihydric phenol compound (Y) contains 96% or more of 4,4'-bisphenol S.

In another embodiment, there is also provided a high molecular weight epoxy resin as described in any of the embodiments above, characterized in that the polymerization reaction is carried out at an equivalent ratio of [epoxy group in difunctional epoxy resin (X)]/[phenolic hydroxyl group in dihydric phenol compound (Y)]=1/0.94 to 1.06.

In yet another embodiment, there is also provided a high molecular weight epoxy resin as described in any of the embodiments above, characterized in that an epoxy equivalent of the high molecular weight epoxy resin is 5,000 g/eq. or more.

In a further embodiment, there is also provided a high molecular weight epoxy resin as described in any of the embodiments above, characterized in that a total content of Li, Na and K in the high molecular weight epoxy resin is 5 ppm or less, a content of nitrogen is 150 ppm or less and a content of phosphorus is 150 ppm or less.

There another embodiment, there is also provided a high molecular weight epoxy resin as described in any of the embodiments above, characterized in that the difunctional epoxy resin (X) is an epoxy resin obtained by condensation reaction of at least one selected from bisphenol A, bisphenol F, bisphenol S, 4,4'-biphenol and 3,3',5,5'-tetramethyl-4,4'-biphenol with an epihalohydrin.

In another embodiment, there is also provided a high molecular weight epoxy resin as described in any one of items (1) to (6), characterized in that the difunctional epoxy resin (X) has a hydrolyzable chlorine concentration of 200 ppm or less and an α-glycol group concentration of 100 meq/kg or less.

In yet another embodiment, there is provided an insulating resinous composition comprising the high molecular weight epoxy resin described in any one of the embodiments above, an epoxy resin other than the high molecular weight epoxy resin and a curing agent as essential components.

There is also provided a resinous composition for a printed circuit board comprising the high molecular weight epoxy resin described in any of the embodiments above, an epoxy resin other than the high molecular weight epoxy resin and a curing agent as essential components.

DETAILED DESCRIPTION OF THE INVENTION

Figure 1:
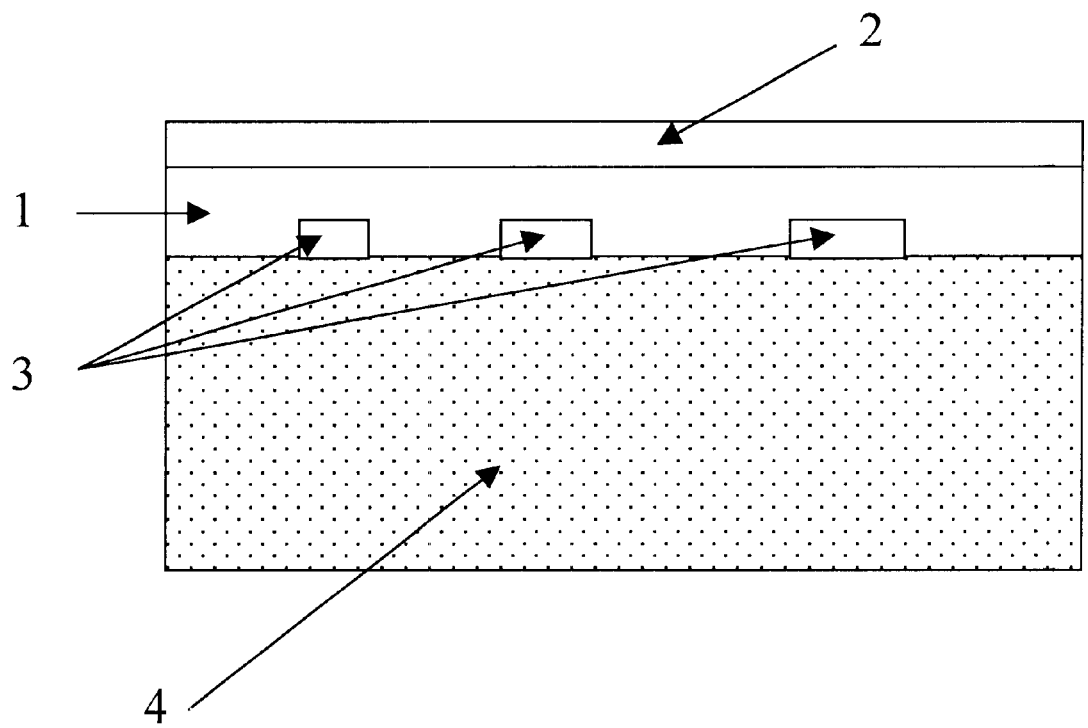
FIG. 1 depicts a cross section of a printed circuit board.

The difunctional epoxy resin (X) to be used for preparation of the high molecular weight epoxy resin according to the present invention may be any compound having two epoxy groups in one molecule, and examples thereof may include bisphenol type epoxy resins such as bisphenol A type epoxy resins, bisphenol F type epoxy resins and bisphenol S type epoxy resins; biphenol type epoxy resins; alicyclic epoxy resins; diglycidyl ethers of monocyclic dihydric phenols such as catechol, resorcin and hydroquinone; diglycidyl ethers of dihydroxynaphthalene; diglycidyl ethers of dihydric alcohols; and diglycidyl ethers of dicarboxylic acids such as phthalic acid, isophthalic acid, tetrahydrophthalic acid and hexahydrophthalic acid, etc. Further, those substituted with non-hindering substituents such as alkyl group, aryl group, ether group and ester group may be included.

Of these epoxy resins, epoxy resins obtained by condensation reaction of dihydric phenol compounds selected from bisphenol A, bisphenol F, bisphenol S, 4,4'-biphenol and 3,3',5,5'-tetramethyl-4,4'-biphenol with an epihalohydrin are preferable. Multiple kinds of these epoxy resins may be used together.

Further, difunctional epoxy resins (X) having a hydrolyzable chlorine concentration of 200 ppm or less and an a-glycol group concentration of 100 meq/kg or less are preferably used as raw materials, wherein hydrolyzable chlorine is an impure terminal group in the difunctional epoxy resins (X). If the hydrolyzable chlorine concentration is above 200 ppm or if the α-glycol concentration is above 100 meq/kg, the prepared high molecular weight epoxy resins cannot be polymerized enough, which is not preferable.

Bisphenol S to be used for preparation of the high molecular weight epoxy resin according to the invention has preferably a purity of 96% or higher, more preferably it has 98% or more of 4,4'-bisphenol S and 2% or less of 2,4'-bisphenol S. If the purity is less than 96%, the prepared high molecular weight epoxy resins cannot be polymerized enough, which is not preferable.

The other dihydric phenol component in the dihydric phenol compound (Y) containing 70–100% by weight of bisphenol S to be used for preparation of high molecular weight epoxy resins according to the invention may be any one of those having two hydroxyl groups bonded to an aromatic ring. Examples thereof may include bisphenols such as bisphenol A, bisphenol F, bisphenol B and bisphenol D, biphenol, catechol, resorcin, hydroquinone, dihydroxynaphthalene etc. Further, those dihydric phenols substituted with non-hindering substituents such as alkyl group, aryl group, ether group and ester group may be included. Of these dihydric phenols, bisphenol A, bisphenol F, 4,4'-biphenol and 3,3',5,5'-tetramethyl-4,4'-biphenol are preferable. Multiple kinds of these dihydric phenols may be used together.

A weight average molecular weight of the high molecular weight epoxy resin according to the invention ranges from 10,000 to 200,000. If it is less than 10,000, sufficient heat resistance cannot be obtained, and if it is above 200,000, handling operation becomes difficult, which are not preferable. From the viewpoints of heat resistance and handling operability of the resin, the weight average molecular weight is preferably within a range of 10,000 to 90,000.

A blending equivalent ratio of the difunctional epoxy resin (X) and dihydric phenol compound (Y) to be used for preparation of the high molecular weight epoxy resin according to the invention is preferably as follows; epoxy group:phenolic hydroxyl group =1:0.94–1.06. If the equivalent ratio is less than 0.94 or if it is above 1.06, sufficiently high molecular weight epoxy resin cannot be obtained.

An epoxy equivalent of the high molecular weight epoxy resin according to the invention may be 5000 g/equivalent or more. In the case that reaction is conducted with an excess of phenolic hydroxyl groups, the epoxy equivalent becomes an infinite value, since an epoxy group concentration becomes almost 0. Therefore, it is substantially meaningless to define the upper limit of the epoxy equivalent.

The catalysts to be used for preparation of high molecular weight epoxy resins according to the invention may be any one of compounds having a catalytic ability to proceed the reaction between an epoxy group with a phenolic hydroxyl group, an alcoholic hydroxyl group or a carboxylic group. For example, there may be mentioned alkali metal compounds, organic phosphorus compounds, tertiary amines, quaternary ammonium salts, cyclic amines, imidazoles, etc.

Listed as specific examples of alkali metal compounds are alkali metal hydroxides such as sodium hydroxide, lithium hydroxide and potassium hydroxide, alkali metal salts such as sodium carbonate, sodium bicarbonate, sodium chloride, lithium chloride and potassium chloride, alkali metal alkoxides such as sodium methoxide and sodium ethoxide, alkali metal phenoxide, sodium hydride, lithium hydride, and alkali metal salts of organic acids such as sodium acetate and sodium stearate.

Listed as specific examples of organic phosphorus compounds are tri-n-propylphosphine, tri-n-butylphosphine, triphenylphosphine, tetramethylphosphonium bromide, tetramethylphosphonium iodide, tetramethylphosphonium hydroxide, trimethylcyclohexylphosphonium chloride, trimethylcyclohexylphosphonium bromide, trimethylbenzylphosphonium chloride, trimethylbenzylphosphonium bromide, tetraphenylphosphonium bromide, triphenylmethylphosphonium bromide, triphenylmethylphosphonium iodide, triphenylethylphosphonium chloride, triphenylethylphosphonium bromide, triphenylethylphosphonium iodide, triphenylbenzylphosphonium chloride, triphenylbenzylphosphonium bromide, etc.

Listed as specific examples of tertiary amines are triethylamine, tri-n-propylamine, tri-n-butylamine, triethanolamine, benzyldimethylamine, etc.

Listed as specific examples of quaternary ammonium salts are tetramethylammonium chloride, tetramethylammonium bromide, tetramethylammonium hydroxide, triethylmethylammonium chloride, tetraethylammonium chloride, tetraethylammonium bromide, tetraethylammonium iodide, tetrapropylammonium bromide, tetrapropylammonium hydroxide, tetrabutylammonium chloride, tetrabutylammonium bromide, tetrabutylammonium iodide, benzyltrimethylammonium chloride, benzyltrimethylammonium bromide, benzyltrimethylammonium hydroxide, benzyltributylammonium chloride, phenyl trimethylammonium chloride, etc.

Listed as specific examples of imidazoles are 2-methylimidazole, 2-ethyl-4-methylimidazole, 2-phenylimidazole, etc.

Listed as specific examples of cyclic amines are 1,8-diazabicyclo(5,4,0)undecene-7, 1,5-diazabicyclo(4,3,0) nonene-5, etc.

These catalysts may be used together.

An amount of the catalyst to be used is generally 0.001–1% by weight of a total solid content contained in the reaction. However, if an alkali metal compound is used, the alkali metal remains in the high molecular weight epoxy resin, which makes an insulating property of a printed circuit board obtained by using it extremely inferior, thus a total content of Li, Na and K in the high molecular weight epoxy resin is necessarily 5 ppm or less, preferably 3 ppm or less. Further, if organic phosphorus compounds, tertiary amines, quaternary ammonium salts, cyclic amines and imidazoles etc. are used as catalysts, they remain in the high molecular weight epoxy resins as remnants, which makes inferior an insulating property of a printed circuit board obtained by using them as in the case of alkali metal remnants, thus a content of nitrogen in the high molecular weight epoxy resin is necessarily 150 ppm or less and that a content of phosphorus in the high molecular weight epoxy resin is necessarily 150 ppm or less. More preferably, the content of nitrogen in the high molecular weight epoxy resin is 100 ppm or less and the content of phosphorus in the high molecular weight epoxy resin is 100 ppm or less.

A solvent may be used in synthetic reaction procedures for preparation of the high molecular weight epoxy resin according to the present invention. The solvent may be any one that dissolves the high molecular weight epoxy resin. For example, there may be mentioned aromatic type solvents, ketone type solvents, amide type solvents and glycol ether type solvents etc.

As specific examples of aromatic type solvents, there may be enumerated benzene, toluene, xylene, etc. As ketone type solvents, there may be mentioned acetone, methyl ethyl ketone, methyl isobutyl ketone, 2-heptanone, 4-heptanone, 2-octanone, cyclohexanone, acetylacetone, dioxane, etc.

As specific examples of amide type solvents, there may be enumerated formamide, N-methylformamide, N,N-dimethylformamide, acetamide, N-methylacetamide, N,N-dimethylacetamide, 2-pyrrolidone, N-methylpyrrolidone, etc.

As specific examples of glycol ether type solvents, there may be enumerated ethylene glycol monomethyl ether, ethylene glycol monoethyl ether, ethylene glycol mono-n-butyl ether, ethylene glycol dimethyl ether, ethylene glycol monoethyl ether acetate, diethylene glycol monomethyl ether, diethylene glycol monoethyl ether, diethylene glycol mono-n-butyl ether, diethylene glycol dimethyl ether, diethylene glycol monoethyl ether acetate, propylene glycol monomethyl ether, propylene glycol mono-n-butyl ether and propylene glycol monomethyl ether acetate etc.

These solvents may be used together.

A concentration of solids in the synthetic reaction for preparation is preferably 35–95%. Further, if any highly viscous product is produced during the reaction, the reaction may be continued with adding the solvent. After the end of the reaction, the solvent may be removed or added furthermore if necessary.

The polymerization reaction for preparing the high molecular weight epoxy resin according to the invention is carried out at such a reaction temperature that the used catalyst does not decompose. The reaction temperature is preferably 50–230° C., more preferably 120–200° C. If solvents with lower boiling points such as acetone and methyl ethyl ketone are used, the reaction temperature can be kept by using an autoclave and carrying out the reaction under higher pressure.

For the resinous composition for the printed circuit board comprising the high molecular weight epoxy resin according to the invention, an epoxy resin other than the high molecular weight epoxy resin and a curing agent as essential components, there may be used, for example, the following various epoxy resins as the epoxy resin other than the high molecular weight epoxy resin; bisphenol A type epoxy resins, bisphenol F type epoxy resins, bisphenol S type epoxy resins, biphenyl type epoxy resins, glycidyl ether type epoxy resins such as phenol novolak type epoxy resins and cresol novolak type epoxy resins, glycidyl ester type epoxy resins, glycidyl amine type epoxy resins, linear aliphatic epoxy resins, alicyclic epoxy resins, heterocyclic epoxy resins, etc.

Further, as curing agents therefor, there may be enumerated aromatic polyamines, dicyandiamides, acid anhydrides, various phenol novolak resins, etc. Further, as curing accelerators therefor, there may be enumerated, for example, benzyl dimethyl amine, amines such as various imidazole type compounds and tertiary phosphines such as triphenylphosphine, etc.

Further, as solvents therefor, there may be mentioned, for example, acetone, methyl ethyl ketone, toluene, xylene, methyl isobutyl ketone, ethyl acetate, ethylene glycol monomethyl ether, N,N-dimethylformamide, N,N-dimethylacetamide, methanol, ethanol, etc. These solvents may be used as mixed solvents of two kinds or more, optionally.

Additionally, there may be used ultraviolet protectors for stable preservation; plasticizers; inorganic fillers such as aluminum hydroxide, alumina, calcium carbonate and silica; and coupling agents such as silane coupling agents and titanate type coupling agents. Further, there may be added non-halogen type flame retardants containing P, N or silicone in order to provide nonflammability.

The resinous compositions comprising the high molecular weight epoxy resin according to the invention can be used for conventional multi-layered electric laminates or novel printed circuit boards such as those obtained by a buildup method. The buildup method is a method in which a build up layer 1 comprising film or films stacked up as an insulating layer of 40–90 μm or a film or films with copper foil layer 2 (copper foil thickness: 9–18 μm) is laminated on an inner circuit board 3 having a glass prepreg 4 laminated thereto, as shown in FIG. 1. General circuit forming steps include a laminate pressing step, a boring step (by means of laser or drill) and desmearing/plating step. These steps provide an excellent method for miniaturization and lightening, since both the mounting area and weight become about ¼ of the conventional laminates having same performances.

In particular, the high molecular weight epoxy resin containing bisphenol S according to the invention is preferably used as a buildup insulating layer 1 after being formed into film. Although a glass transition temperature (Tg) of the conventional bisphenol A type high molecular weight epoxy resin is 95° C. and that of the brominated bisphenol A type high molecular weight epoxy resin is 125° C., a glass transition temperature of the high molecular weight epoxy resin containing bisphenol S may be 155° C. depending on constitutional components. Thus, the latter resin is superior in heat resistance. Therefore, it is effective to use the highly heat resistant high molecular weight epoxy resin containing bisphenol S for the build up layer 1 having a thickness of 40–90 μm. Further, since the resin does not substantially contain bromine and the bisphenol S chemical structure is nonflammable, the resin has possibility for development of non-halogen type ones. Although a coefficient of linear expansion in the conventional epoxy resins is about 70 ppm/°C., a coefficient of linear expansion in the high molecular weight epoxy resin containing bisphenol S is 50–60 ppm/°C. The latter is preferable, since any strain or warp does not occur during formation of the printed circuit board.

EXAMPLES

The present invention will be illustrated further with reference to the following examples, but the invention is not limited thereto.

Examples 1–12 and Comparative Examples 1–11

A difunctional epoxy resin (X), a dihydric phenol compound (Y) and a catalyst in blending amounts as shown in Table 1, and 55 parts by weight of cyclohexanone were introduced in a pressure reactor and subjected to polymerization reaction in a nitrogen gas atmosphere at 180° C. for 5 hours. Analyses for properties of the thus obtained resin were carried out according to the following methods. Analytical results are shown in Table 1.

Weight average molecular weight: It is measured as a polystyrene converted value by a gel permeable chromatography.

Epoxy equivalent: It is measured by a potentiometric titration method and converted into a value as a resinous solids content.

Hydrolyzable chlorine: It is measured by a potentiometric titration using an NaOH alcoholic solution and converted into a value as a resinous solids content.

α-Glycol: It is measured by a potentiometric titration using $HIO_4$ and sodium thiosulfate and converted into a value as a resinous solids content.

Contents of Li, Na and K: They are measured by an atomic absorption spectrometry and converted into values as a resinous solids content.

Content of nitrogen: It is measured by a nitrogen analytical meter and converted into a value as a resinous solids content.

Content of phosphorus: It is measured by a fluorescent X-ray device and converted into a value as a resinous solids content.

TABLE 1

| | Example | | | | | | Comparative example | | | | | |
|---|---|---|---|---|---|---|---|---|---|---|---|---|
| | 1 | 2 | 3 | 4 | 5 | 6 | 1 | 2 | 3 | 4 | 5 | 6 |
| BLENDING | | | | | | | | | | | | |
| *Difunct. epoxy resin (X)* | | | | | | | | | | | | |
| Kind | A | D | E | A | A | B | A | A | D | D | D | A |
| Amount pbw | 100 | 100 | 100 | 100 | 100 | 100 | 100 | 100 | 100 | 100 | 100 | 100 |
| Kind | — | — | — | — | — | — | — | — | — | — | — | — |
| Amount pbw | — | — | — | — | — | — | — | — | — | — | — | — |
| *Dihydric phenol (Y)* | | | | | | | | | | | | |
| Kind | H1 | H1 | H1 | H1 | H1 | H1 | H1 | H2 | H1 | H1 | H1 | F |
| Amount pbw | 65.89 | 68.92 | 70.00 | 46.12 | 52.71 | 72.92 | 62.50 | 65.89 | 66.22 | 66.22 | 39.72 | 62.54 |
| Kind | | | | F | G | | | | | | F | |
| Amount pbw | | | | 19.76 | 13.18 | | | | | | 26.49 | |
| *Compound (Z)* | | | | | | | | | | | | |
| Kind | — | — | — | — | — | — | — | — | — | — | — | — |
| Amount pbw | — | — | — | — | — | — | — | — | — | — | — | — |
| *Catalyst* | | | | | | | | | | | | |
| Kind | I | L | J | M | I | I | I | I | I | K | I | I |
| Amount pbw | 0.1 | 0.1 | 0.2 | 0.3 | 0.1 | 0.1 | 0.1 | 0.1 | 0.1 | 0.1 | 0.1 | 0.1 |
| Blending eq. Ratio ep:phenolicOH | 1:0.98 | 1:1.02 | 1:0.98 | 1:0.99 | 1:0.97 | 1:0.98 | 1:0.93 | 1:0.98 | 1:1.07 | 1:0.98 | 1:0.98 | 1:0.98 |
| PROPERTIES OF HIGH MOLECULAR WEIGHT EPOXY RESIN | | | | | | | | | | | | |
| Wt. average MW | 38000 | 35000 | 36000 | 34000 | 31000 | 34000 | 8000 | 7000 | 6000 | 31000 | 25000 | 50000 |
| Epoxy eq. g/Equivalent | 18000 | 80000 | 17000 | 16000 | 15000 | 19000 | 3200 | 2900 | 3000 | 15000 | 9000 | 10000 |
| Content of BPS in dihydric phenol % | 100 | 100 | 100 | 70 | 80 | 100 | 100 | 100 | 100 | 100 | 60 | 0 |
| Contents of Li, Na and K ppm | 1 or less | 1 or less | 1 or less | 1 or less | 1 or less | 1 or less | 1 or less | 1 or less | 1 or less | 277 | 1 or less | 1 or less |
| Content of nitrogen ppm | 145 | 30 | 1 or less | 1 or less | 145 | 145 | 145 | 145 | 145 | 1 or less | 145 | 145 |
| Content of phosphorus ppm | 1 or less | 1 or less | 94 | 118 | 1 or less | 1 or less | 1 or less | 1 or less | 1 or less | 1 or less | 1 or less | 1 or less |
| Tg (DMAmethod) ° C. | 130 | 150 | 155 | 115 | 120 | 110 | 108 | 105 | 110 | 150 | 110 | 95 |

A to M in Table 1 have the following meanings.

A: bisphenol A diglycidyl ether [epoxy equivalent: 186 g/eq., hydrolyzable chlorine concentration: 40 wtppm, α-glycol concentration: 40 meq./kg, trade name: Epikote 828 (made by Yuka Shell Epoxy K.K.)]

B: bisphenol F diglycidyl ether [epoxy equivalent: 168 g/eq., hydrolyzable chlorine concentration: 50 wtppm, α-glycol concentration: 60 meq./kg, trade name: Epikote 806 (made by Yuka Shell Epoxy K.K.)]

C: bisphenol S diglycidyl ether [epoxy equivalent: 199 g/eq., hydrolyzable chlorine concentration: 65 wtppm, α-glycol concentration: 50 meq./kg]

D: 3,3',5,5'-tetramethyl-4,4'-biphenol diglycidyl ether [epoxy equivalent: 185 g/eq., hydrolyzable chlorine concentration: 40 wtppm, α-glycol concentration: 50 meq./kg, trade name: Epikote YX4000 (made by Yuka Shell Epoxy K.K.)]

E: 1:1 mixture of 4,4'-biphenol diglycidyl ether and 3,3',5,5'-tetramethyl-4,4'-biphenol diglycidyl ether [epoxy equivalent: 175 g/eq., hydrolyzable chlorine concentration: 50 wtppm, α-glycol concentration: 40 meq./kg, trade name: Epikote YL6121H (made by Yuka Shell Epoxy K.K.)]

F: bisphenol A (phenolic hydroxyl group equivalent: 114 g/eq.)

G: bisphenol F (phenolic hydroxyl group equivalent: 100 g/eq.)

$H_1$: bisphenol S (phenolic hydroxyl group equivalent: 125 g/eq., 99.8% or more of 4,4'-bisphenol S)

$H_2$: bisphenol S (phenolic hydroxyl group equivalent: 125 g/eq., 90–95% of 4,4'-bisphenol S)

I: 2-ethyl-4-methylimidazole (nitrogen content: 29.1 wt %)

J: benzyl triphosphonium chloride (phosphorus content: 7.96 wt %)

K: 20 wt % aqueous sodium hydroxide solution (Na content: 11.50 wt %)

L: 29 wt % aqueous tetramethyl ammonium hydroxide solution (nitrogen content: 4.46 wt %)

M: triphenylphosphine (phosphorus content: 11.83 wt %)

After glass fabrics were impregnated with the epoxy resins obtained in the above-mentioned Examples and Comparative Examples (Examples 1,2,3 and 4 as well as Comparative Examples 5 and 6) and commercially available epoxy resins, the impregnated fabrics were dried in a drying cabinet at 150° C. for 8 minutes, to obtain prepregs in B stage.

Epikote 5046: trade name of Yuka Shell Epoxy K.K., brominated bisphenol A type epoxy resin, epoxy equivalent: 475 g/eq., bromine content: 21 wt %

Epikote 1001: trade name of Yuka Shell Epoxy K.K., bisphenol A type epoxy resin, epoxy equivalent: 470 g/eq Epikote 180S70: trade name of Yuka Shell Epoxy K.K., cresol novolak type epoxy resin, epoxy equivalent: 210 g/eq A test method and an evaluation method for curing properties are as follows.

(1) Glass transition temperature: It is measured by DSC.

(2) Boiling water resistance (It is carried out as an accelerating test for water resistance): After dipping cured substances in the form of a disk (diameter: 50 mm, thickness: 3 mm, curing conditions: 80° C. for 10 hours +120° C. for 2 hours +175° C. for 2 hours) in boiling water (98° C. or higher) for 4 hours, presence or absence of abnormality is judged visually, and evaluated by the following standards.

A: absence of abnormality
B: discoloration into white on a partial surface
C: discoloration into white on the whole surface (3) Peel strength: It is measured according to JIS C6481.

TABLE 2

| | | | Evaluated results of laminates | | | | | | | | | |
|---|---|---|---|---|---|---|---|---|---|---|---|---|
| | | | Example | | | | | | Comparative Example | | | | |
| | | | 7 | 8 | 9 | 10 | 11 | 12 | 7 | 8 | 9 | 10 | 11 |
| Blend ratio pbw | Epoxy resin | Example 1 | 100 | | | | 100 | | | | | | |
| | | Example 2 | | 100 | | | | 100 | | | | | |
| | | Example 3 | | | 100 | | | | | | | | |
| | | Example 4 | | | | 100 | | | | | | | |
| | | Example 5 | | | | | | | 100 | | | | |
| | | Example 6 | | | | | | | | 100 | | | |
| | | Epikote 1256B40 | | | | | | | | | 100 | | |
| | | Epikote 5046 | | | | | | | | | | 100 | |
| | | Epikote 1001 | 38 | 38 | 38 | 38 | | | 38 | 38 | 38 | 38 | 100 |
| | | Epikote 180S70 | | | | | 38 | 38 | | | | | 38 |
| | Cure agent | dicyandiamide | 3.2 | 3.2 | 3.2 | 3.2 | 3.2 | 3.2 | 3.2 | 3.2 | 3.2 | 3.2 | 3.2 |
| | Accl. | 2-ethyl-4-methyl imidazole | 0.22 | 0.22 | 0.22 | 0.22 | 0.22 | 0.22 | 0.22 | 0.22 | 0.22 | 0.22 | 0.22 |
| | Solv. | Methyl ethyl ketone | 6.0 | 6.0 | 6.0 | 6.0 | 6.0 | 6.0 | 6.0 | 6.0 | 6.0 | 6.0 | 6.0 |
| | | Methyl cellosolve | 6.0 | 6.0 | 6.0 | 6.0 | 6.0 | 6.0 | 6.0 | 6.0 | 6.0 | 6.0 | 6.0 |
| | | Dimethyl formamide | 3.7 | 3.7 | 3.7 | 3.7 | 3.7 | 3.7 | 3.7 | 3.7 | 3.7 | 3.7 | 3.7 |
| Cure cond. | Temperature (° C.) | | 175 | 175 | 175 | 175 | 175 | 175 | 175 | 175 | 175 | 175 | 175 |
| | Time (hr) | | 2 | 2 | 2 | 2 | 2 | 2 | 2 | 2 | 2 | 2 | 2 |
| Cure prop. | Glass transition temperature (° C.) | | 165 | 175 | 180 | 160 | 178 | 190 | 128 | 125 | 126 | 140 | 120 |
| | Boiling water resistance | | A | A | A | A | A | A | B | B | B | C | C |
| | Peel strength (KN/m) | | 1.8 | 1.9 | 2.0 | 1.7 | 1.7 | 1.8 | 1.6 | 1.5 | 1.6 | 1.5 | 1.4 |

8 prepregs obtained by cutting the above-mentioned prepregs were laminated with one copper foil and heated at 175° C. for 120 minutes with pressurizing at 40 kgf/cm², to make laminates.

The commercially available epoxy resins used were as follows.

Epikote 1256B40: trade name of Yuka Shell Epoxy K.K., bisphenol A type phenoxy resin, epoxy equivalent: 8000 g/eq.

As clear from the comparisons shown in Table 2 of physical properties of laminates made by using resinous compositions containing high molecular weight epoxy resins according to the invention with those of laminates made by using epoxy resinous compositions in Comparative Examples, the laminates made by using resinous compositions according to the invention are eminently superior in heat resistance (glass transition temperature), boiling water resistance and adhesiveness collectively.

What we claim is:

1. A resinous composition for a printed circuit board comprising a high molecular weight epoxy resin, an epoxy resin other than said high molecular weight epoxy resin and a curing agent as essential components, said high molecular weight epoxy resin obtained by polymerization reaction of a difunctional epoxy resin (X) with a dihydric phenol compound (Y) containing 70–100% by weight of bisphenol S, in the presence of a catalyst, the high molecular weight epoxy resin being characterized in that a weight average molecular weight thereof is 10,000–200,000.

2. The composition as claimed in claim 1, characterized in that bisphenol S in the dihydric phenol compound (Y) contains 96% or more of 4,4'-bisphenol S.

3. The composition as claimed in claim 1, characterized in that said polymerization reaction is carried out at an equivalent ratio of (epoxy group in difunctional epoxy resin (X))/(phenolic hydroxyl group in dihydric phenol compound (Y))=1/0.94 to 1.06.

4. The composition as claimed in any claim 1, characterized in that an epoxy equivalent of the high molecular weight epoxy resin is 5,000 g/eq. or more.

5. The composition as claimed in claim 1, characterized in that a total content of Li, Na and K in the high molecular weight epoxy resin is 5 ppm or less, a content of nitrogen is 150 ppm or less and a content of phosphorus is 150 ppm or less.

6. The composition as claimed in claim 1, characterized in that the difunctional epoxy resin (X) is an epoxy resin obtained by condensation reaction of at least one selected from bisphenol A, bisphenol F, bisphenol S, 4,4'-biphenol and 3,3',5,5'-tetramethyl-4,4'-biphenol with an epihalohydrin.

7. The composition as claimed in claim 6, characterized in that bisphenol S in the dihydric phenol compound (Y) contains 96% or more of 4,4'-bisphenol S.

8. The composition as claimed in claim 1, characterized in that said difunctional epoxy resin (X) has a hydrolyzable chlorine concentration of 200 ppm or less and an α-glycol group concentration of 100 meq/kg or less.

9. The composition as claimed in claim 8, characterized in that bisphenol S in the dihydric phenol compound (Y) contains 96% or more of 4,4'-bisphenol S.

10. A high molecular weight epoxy resin obtained by polymerization reaction of a difunctional epoxy resin (X) with a dihydric phenol compound (Y) containing 70–100% by weight of bisphenol S, in the presence of a catalyst, the high molecular weight epoxy resin being characterized in that a weight average molecular weight thereof is 10,000–200,000, wherein the total content of Li, Na and K in the high molecular weight epoxy resin is 5 ppm or less, a content of nitrogen is 150 ppm or less and a content of phosphorus is 150 ppm or less.

11. The high molecular weight epoxy resin as claimed in claim 10, characterized in that bisphenol S in the dihydric phenol compound (Y) contains 96% or more of 4,4'-bisphenol S.

12. The high molecular weight epoxy resin as claimed in claim 11, characterized in that bisphenol S in the dihydric phenol compound (Y) contains 98% or more of 4,4'-bisphenol S.

13. The high molecular weight epoxy resin as claimed in any claim 10, characterized in that an epoxy equivalent of the high molecular weight epoxy resin is 5,000 g/eq. or more.

14. A high molecular weight epoxy resin obtained by polymerization reaction of a difunctional epoxy resin (X) with a dihydric phenol compound (Y) containing 70–100% by weight of bisphenol S, in the presence of a catalyst, the high molecular weight epoxy resin being characterized in that a weight average molecular weight thereof is 10,000–200,000, wherein said difunctional epoxy resin (X) has a hydrolyzable chlorine concentration of 200 ppm or less and an α-glycol group concentration of 100 meq/kg or less.

15. The high molecular weight epoxy resin as claimed in claim 14, characterized in that bisphenol S in the dihydric phenol compound (Y) contains 96% or more of 4,4'-bisphenol S.

16. The high molecular weight epoxy resin as claimed in claim 15, characterized in that bisphenol S in the dihydric phenol compound (Y) contains 98% or more of 4,4'-bisphenol S.

17. The high molecular weight epoxy resin as claimed in any claim 14, characterized in that an epoxy equivalent of the high molecular weight epoxy resin is 5,000 g/eq. or more.

18. A high molecular weight epoxy resin obtained by polymerization reaction of a difunctional epoxy resin (X) with a dihydric phenol compound (Y) containing 70–100% by weight of bisphenol S, in the presence of a catalyst, the high molecular weight epoxy resin being characterized in that a weight average molecular weight thereof is 10,000–200,000, wherein said difunctional epoxy resin (X) has a hydrolyzable chlorine concentration of 200 ppm or less and an α-glycol group concentration of 100 meq/kg or less.

* * * * *